US011545814B2

(12) United States Patent
Ariga et al.

(10) Patent No.: US 11,545,814 B2
(45) Date of Patent: Jan. 3, 2023

(54) SEMICONDUCTOR LASER MODULE AND METHOD OF MANUFACTURING SEMICONDUCTOR LASER MODULE

(71) Applicant: FURUKAWA ELECTRIC CO., LTD., Tokyo (JP)

(72) Inventors: Maiko Ariga, Tokyo (JP); Yusuke Inaba, Tokyo (JP); Kazuki Yamaoka, Tokyo (JP); Toshio Sugaya, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 852 days.

(21) Appl. No.: 16/444,778

(22) Filed: Jun. 18, 2019

(65) Prior Publication Data
US 2019/0312414 A1 Oct. 10, 2019

Related U.S. Application Data

(63) Continuation of application No. PCT/JP2017/046089, filed on Dec. 22, 2017.

(30) Foreign Application Priority Data

Dec. 22, 2016 (JP) .............................. JP2016-250076

(51) Int. Cl.
H01S 5/50 (2006.01)
H01S 5/10 (2021.01)
(Continued)

(52) U.S. Cl.
CPC .................. H01S 5/50 (2013.01); G02B 6/42 (2013.01); H01S 5/022 (2013.01);
(Continued)

(58) Field of Classification Search
None
See application file for complete search history.

(56) References Cited

U.S. PATENT DOCUMENTS 4,118,633 A * 10/1978 Guilleman ............ H01L 31/167
257/E31.108
7,978,737 B2 7/2011 De Gabory et al.
(Continued)

FOREIGN PATENT DOCUMENTS

CN 102449521 A 5/2012
CN 102629732 A 8/2012
(Continued)

OTHER PUBLICATIONS

International Search Report dated Mar. 20, 2018 in PCT/JP2017046089 filed Dec. 22, 2017 (with English Translation).
(Continued)

Primary Examiner — David W Lambert
(74) Attorney, Agent, or Firm — Oblon, McClelland, Maier & Neustadt, L.L.P.

(57) ABSTRACT

A disclosed semiconductor laser module includes a semiconductor laser device; a waveguide optical function device that has an incidence end on which laser light emitted from the semiconductor laser device is incident and that guides the incident light; and a protrusion that is provided on an extension line of a light path of the laser light emitted from the semiconductor laser device, the extension line extending beyond the incidence end.

10 Claims, 8 Drawing Sheets

(51) Int. Cl.
  *H01S 5/40* (2006.01)
  *G02B 6/42* (2006.01)
  *H01S 5/022* (2021.01)
  *H01S 5/02326* (2021.01)
  *H01S 5/00* (2006.01)

(52) U.S. Cl.
  CPC .......... *H01S 5/02326* (2021.01); *H01S 5/101* (2013.01); *H01S 5/40* (2013.01); *H01S 5/005* (2013.01)

(56) References Cited

U.S. PATENT DOCUMENTS

| | | | |
|---|---|---|---|
| 9,054,480 | B2 | 6/2015 | Daiber |
| 2004/0021061 | A1* | 2/2004 | Bijkerk ............... G03F 7/70558 250/214 R |
| 2004/0264538 | A1 | 12/2004 | Namiwaka et al. |
| 2004/0264891 | A1 | 12/2004 | Namiwaka et al. |
| 2008/0166098 | A1 | 7/2008 | Ibe et al. |
| 2009/0226138 | A1* | 9/2009 | Kelly ..................... H04B 10/40 385/89 |
| 2010/0303109 | A1 | 12/2010 | Bhagavatula et al. |
| 2011/0267682 | A1 | 11/2011 | Bhagavatula et al. |
| 2012/0201259 | A1 | 8/2012 | Watanabe et al. |
| 2015/0103853 | A1* | 4/2015 | Kurobe .................. H01S 5/024 372/34 |
| 2016/0013616 | A1 | 1/2016 | Yamauchi |

FOREIGN PATENT DOCUMENTS

| | | |
|---|---|---|
| CN | 204258035 U | 4/2015 |
| EP | 1 492 208 A2 | 12/2004 |
| JP | 2005-17839 A | 1/2005 |
| JP | 2005-19820 A | 1/2005 |
| JP | 2006-216695 | 8/2006 |
| JP | 2006-216791 | 8/2006 |
| JP | 2008-90128 A | 4/2008 |
| JP | 2008-90129 A | 4/2008 |
| JP | 2012-164737 | 8/2012 |
| JP | 2016-18121 A | 2/2016 |
| JP | 2016-28273 A | 2/2016 |
| WO | WO 2007/032182 A1 | 3/2007 |
| WO | WO2007/108508 A1 | 9/2007 |
| WO | WO2010/138478 A1 | 12/2010 |
| WO | WO2013/180291 A1 | 12/2013 |

OTHER PUBLICATIONS

Written Opinion dated Mar. 20, 2018 in PCT/JP2017046089 filed Dec. 22, 2017.

Combined Chinese Office Action and Search Report dated Jun. 18, 2020 in Chinese Patent Application No. 201780079212.5 (with unedited computer generated English translation of the Office Action), 9 pages.

Notice of Reasons for Refusal dated Dec. 7, 2021 in Japanese Patent Application No. 2018-558086 (with Enligsh machine translation), 7 pages.

* cited by examiner

SEMICONDUCTOR LASER MODULE AND METHOD OF MANUFACTURING SEMICONDUCTOR LASER MODULE

CROSS-REFERENCE TO RELATED APPLICATION(S)

This application is a continuation of International Application No. PCT/JP2017/046089, filed on Dec. 22, 2017 which claims the benefit of priority of the prior Japanese Patent Application No. 2016-250076, filed on Dec. 22, 2016, the entire contents of which are incorporated herein by reference.

BACKGROUND

The present disclosure relates to a semiconductor laser module and a method of manufacturing a semiconductor laser module.

In the past, semiconductor laser modules have been widely used as light sources for optical communication. Such modules include a semiconductor laser device (LD), which serves as a light source, and a semiconductor optical amplifier (SOA), which is configured to amplify laser light emitted from the semiconductor laser device. With such a configuration, high power laser light can be output from the semiconductor laser module. Integrating the semiconductor laser device and the semiconductor optical amplifier on the same element is also employed commonly (see, for example, Japanese Laid-open Patent Publication No. 2006-216791, Japanese Laid-open Patent Publication No. 2006-216695, U.S. Pat. No. 9,054,480, and International Publication No. WO 2013/180291).

In recent years, however, with a further increase in the demand for high output in optical communication, the electric current supplied to the semiconductor laser device and the semiconductor optical amplifier has been increasing. This results in an increase in an amount of heat generated by the semiconductor laser device and the semiconductor optical amplifier. Thus, there is an increasing demand for a configuration of semiconductor laser module where the semiconductor laser device and the semiconductor optical amplifier are separated from each other and temperature-controlled separately. Performing temperature control separately on the semiconductor laser device and the semiconductor optical amplifier with different thermoelectric elements leads to lowering the total power consumption to adjust the temperature of the thermoelectric elements.

On the other hand, when a configuration is employed in which the semiconductor laser device and the semiconductor optical amplifier are separated from each other, it is necessary to spatially couple laser light emitted from the semiconductor laser device to the semiconductor optical amplifier accurately. In other words, a new technical challenge is posed to accurately perform relative alignment between the semiconductor laser device and the semiconductor optical amplifier. The challenge to perform alignment in spatial coupling is not limited to semiconductor optical amplifiers but to other semiconductor laser modules each including a waveguide optical function device, such as an optical modulator or a waveguide device made of quartz, silicon, polymer, and the like, and a semiconductor laser device.

SUMMARY

According to a first aspect of the present disclosure, a semiconductor laser module is provided which includes a semiconductor laser device; a waveguide optical function device that has an incidence end on which laser light emitted from the semiconductor laser device is incident and that guides the incident light; and a protrusion that is provided on an extension line of a light path of the laser light emitted from the semiconductor laser device, the extension line extending beyond the incidence end.

According to a second aspect of the present disclosure, a semiconductor laser module is provided which includes a semiconductor laser device; a waveguide optical function device that has an incidence end on which laser light emitted from the semiconductor laser device is incident and that guides the incident light; and a submount onto which the waveguide optical function device and a protrusion are fixed together. The protrusion is provided on a straight line that is parallel with an extension line of a light path of the laser light that is emitted from the semiconductor laser device, the extension line extending beyond the incidence end.

According to a second aspect of the present disclosure, a method of manufacturing a semiconductor laser module including a semiconductor laser device and a waveguide optical function device on which laser light emitted from the semiconductor laser device is incident and that guides the incident light. The method includes fixing the semiconductor laser device on a substrate of the semiconductor laser module; fixing, onto the semiconductor laser device, a collimating lens that renders the laser light that is emitted from the semiconductor laser device into parallel light; positioning a first submount onto which the waveguide optical function device and a protrusion that is provided on an extension line in an incidence direction from an incidence end of the waveguide in the waveguide optical function device are fixed together such that the laser light that is rendered by the collimating lens into parallel light reaches the protrusion and fixing the first submount onto the substrate; and fixing, between the collimating lens and the waveguide optical function device, a condenser lens for causing the laser light that is rendered by the collimating lens into parallel light to be concentrated on the incidence end of the waveguide in the waveguide optical function device.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

Semiconductor laser modules and methods of manufacturing a semiconductor laser module according to embodiments of the present disclosure will be described below with reference to the drawings. The present disclosure is not limited by the embodiment described below. Furthermore, any components that are the same as or corresponding to each other are assigned with the same reference sign, as appropriate, throughout the drawings. Moreover, the drawings are schematic, and dimensions of each component may be different from the actual ones. In addition, a portion having different dimensional relations and ratios among the drawings may be included.

First Embodiment

Figure 1:
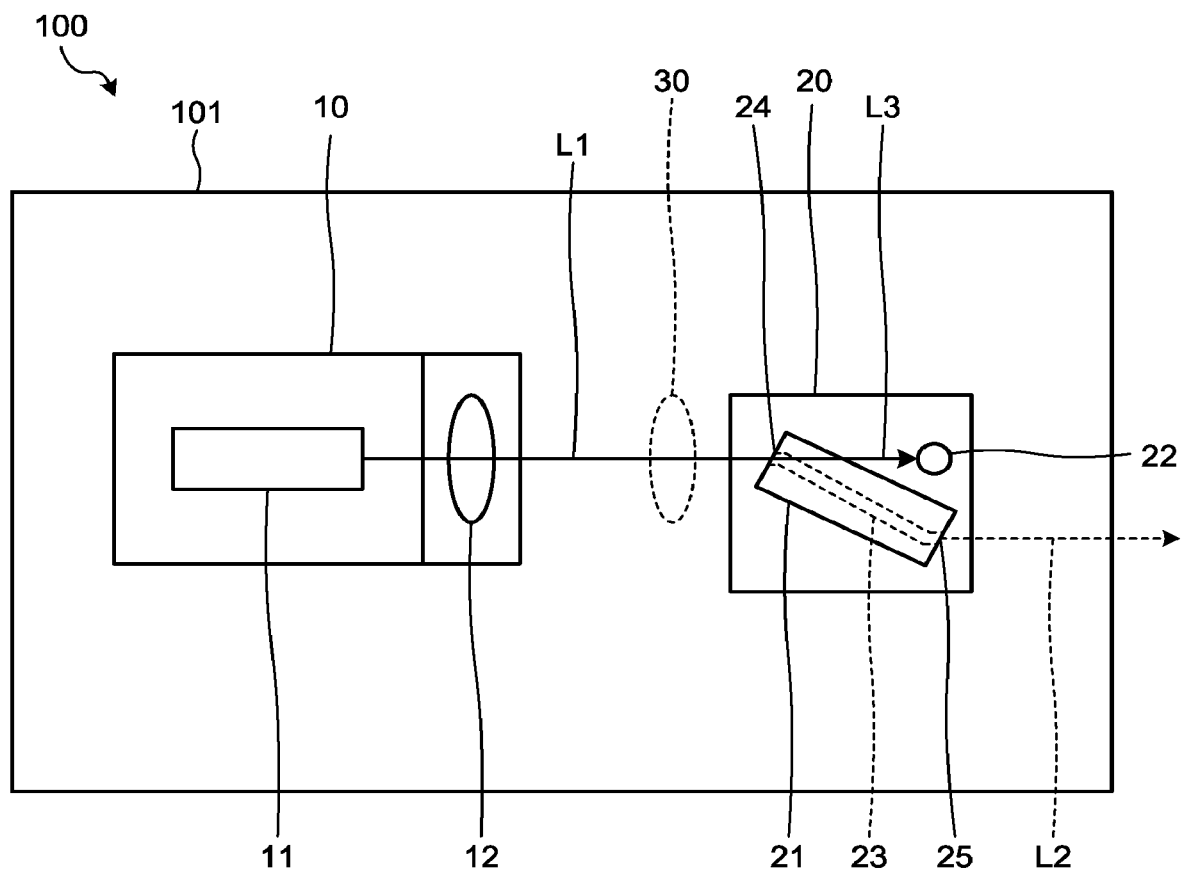
FIG. 1 is a diagram of a schematic configuration of a semiconductor laser module according to a first embodiment.

FIG. 1 is a diagram of a schematic configuration of a semiconductor laser module according to a first embodiment. The semiconductor laser module according to the first embodiment illustrated in FIG. 1 represents only a basic configuration and an accrual semiconductor laser module may include various additional components as in embodiments described below.

As illustrated in FIG. 1, a semiconductor laser module 100 according to the first embodiment includes a semiconductor laser device (LD) 11, a semiconductor optical amplifier (SOA) 21, a protrusion 22, and an SOA submount 20. Furthermore, as illustrated in FIG. 1, the semiconductor laser module 100 includes a collimating lens 12, a condenser lens 30, and an LD submount 10. The semiconductor laser module 100 may have a configuration in which the components are provided on a substrate 101 that is housed in a casing of the semiconductor laser module 100 or a configuration in which a bottom board of the casing of the semiconductor laser module 100 serves as the substrate 101 and the components are provided on the bottom board.

The semiconductor laser device 11 is a device that causes lasing with electric current injected thereto, and thus emits laser light. The semiconductor laser device 11 is, for example, a distributed-feedback semiconductor laser of which the emission wavelength can be changed by temperature control.

The semiconductor optical amplifier 21 is an exemplary representative of a waveguide optical function device including a waveguide 23 on which the laser light emitted from the semiconductor laser device 11 is incident and that guides the incident laser light, and an optical modulator is exemplified as another example of the waveguide optical function device. As illustrated in FIG. 1, the entire semiconductor optical amplifier 21 is arranged obliquely to a light path L1 of the laser light emitted from the semiconductor laser device 11. Thus, the waveguide 23 of the semiconductor optical amplifier 21 includes a curve waveguide formed near an incidence end 24. The exemplary semiconductor optical amplifier 21 illustrated in FIG. 1 is configured such that a curved waveguide is formed also near an emission end 25. A light path L2 of the laser light is emitted from the semiconductor optical amplifier 21 is approximately parallel with the light path L1. Further other examples of the waveguide optical function device including a waveguide include a quartz glass system optical waveguide device, such as a planar lightwave circuit (PLC), a silicon waveguide deice, and a polymer waveguide device.

The protrusion 22 is a wire ball that is provided on an extension line L3 of the light path L1 of the laser light emitted from the semiconductor laser device 11. The extension line L3 is an imaginary line extending beyond (or passing through) the incidence end 24 of the waveguide in the semiconductor optical amplifier 21. The protrusion 22 is a semi-sphere structure for a normal wire bonding and is formed of metal, such as gold (Au). Namely, such a semi-sphere structure may be a structure that is widely used to connect a bonding wire thereto, but is not used for such a purpose here. The wire ball serving as the protrusion 22 is used to position the semiconductor optical amplifier 21 (rough adjustment) as described below. Using the wire ball as the protrusion 22 is convenient because the protrusion 22 can be formed during normal wiring process; however, the protrusion 22 is not limited to wire ball. For example, a structure that has a cylindrical shape obtained by cutting a wire that is formed once (containing curved structure) or that is able to reflect or scatter laser light is usable appropriately.

The SOA submount 20 is a submount onto which the semiconductor optical amplifier 21 is fixed together with the protrusion 22. As to heights of the semiconductor optical amplifier 21 and the protrusion 22 on the SOA submount 20, a height of the protrusion 22 is greater than a height of the semiconductor optical amplifier 21. When the semiconductor optical amplifier 21 and the protrusion 22 are fixed on the SOA submount 20 at the same plane, the height of the protrusion 22 is greater than the thickness of the semiconductor optical amplifier 21. In general, the semiconductor optical amplifier 21 has a shape of plate and has an approximately constant thickness. When the thickness is not constant, the thickness is defined by a thickness of a thickest part thereof.

As described above, the protrusion 22 is provided on the extension line L3 of the light path L1 of the laser light emitted from the semiconductor laser device 11, the extension line extending beyond the incidence end 24 of the waveguide in the semiconductor optical amplifier 21, which allows a relative positional relationship between the semiconductor optical amplifier 21 and the protrusion 22 to be determined. Namely, by using the protrusion 20 as a target to position the SOA submount 20, the semiconductor optical amplifier 21 can be positioned desirably. Incidentally, the protrusion 22 is not limited to being fixed on the submount (the SOA submount 20). When the waveguide optical function device is fixed onto a base together with each optical part, the protrusion may be fixed onto a metalized thermoelectric element. In these cases, the protrusion is also fixed onto the base having the waveguide device (waveguide optical function device) fixed thereon. Furthermore, when the waveguide contained in the waveguide optical function device is close to the top surface of the device, the protrusion may be fixed onto the waveguide optical function device. In the case of an optical modulator or other waveguide optical function devices, the waveguide is close to the top surface of the device and the area of the device is large and thus it is possible to fix the protrusion onto the device.

The collimating lens 12 is an optical element for rendering the laser light emitted from the semiconductor laser device 11 into parallel light. The collimating lens 12 is designed such that a diameter of the laser light rendered by the collimating lens 12 into parallel light is larger than the thickness of the semiconductor optical amplifier 21. In the configuration example of the semiconductor laser module 100 illustrated in FIG. 1, the collimating lens 12 and the semiconductor laser device 11 are arranged on the same LD submount 10. The position in which the collimating lens 12 is arranged is however not limited to this, and the collimating lens 12 may be fixed onto the semiconductor laser module 100 independently of the semiconductor laser device 11. The collimating lens 12 is not limited to a device that is independent of the semiconductor laser device 11, and it is possible to employ a configuration in which the collimating lens 12 is formed on an emission end face of the semiconductor laser device 11.

The condenser lens 30 is an optical element for causing the laser light, which is rendered by the collimating lens 12 into parallel light, to be concentrated on the incidence end 24 of the waveguide of the semiconductor optical amplifier 21. As described below, the condenser lens 30 is arranged during the process of manufacturing a semiconductor laser module. In a state where the condenser lens 30 is arranged, the laser light, which is rendered by the collimating lens 12 into parallel light, on the light path L1 is concentrated on the incidence end 24 of the waveguide of the semiconductor optical amplifier 21, is guided through the waveguide 23 in the semiconductor optical amplifier 21, and then is emitted to a light path L2 from the emission end 25 of the semiconductor optical amplifier 21.

On the other hand, in a state where the condenser lens 30 is not arranged, the diameter of the laser light that is rendered by the collimating lens into parallel light is larger than the thickness of the semiconductor optical amplifier 21 and thus part of the laser light traveling along the light path L1 passes above the semiconductor optical amplifier 21 and reaches the protrusion 22 that is provided on the extension line L3 of the light path L1, the extension line L3 extending beyond the incidence end 24 of the waveguide in the semiconductor optical amplifier 21. The protrusion 22 is a structure, such as a wire ball, on which laser light can reflect or scatter and thus the laser light having reached the protrusion 22 is reflected or scattered on the protrusion 22, which makes it possible to check that the laser light has reached the protrusion 22.

When the SOA submount 20 is arranged using the relationship above such that the laser light, which is rendered by the collimating lens 12 into parallel light, reaches the protrusion 22 in the state where the condenser lens 30 is not arranged, a rough adjustment may be realized, so that the laser light, which is emitted from the semiconductor laser device 11, is spatially coupled to the incidence end 24 of the waveguide 23 in the semiconductor optical amplifier 21 when the condenser lens 30 is arranged. Furthermore, finely adjusting arrangement of the condenser lens 30 makes it possible to realize arrangement enabling appropriate spatial coupling of the laser light, which is emitted from the semiconductor laser device 11, to the incidence end 24 of the waveguide in the semiconductor optical amplifier 21. It is possible to perform the fine adjustment while observing the intensity of the laser light that is output from the semiconductor optical amplifier 21.

A method of manufacturing a semiconductor laser module will be described using the configuration example of the semiconductor laser module 100 according to the above-described first embodiment will be described.

Figure 2:
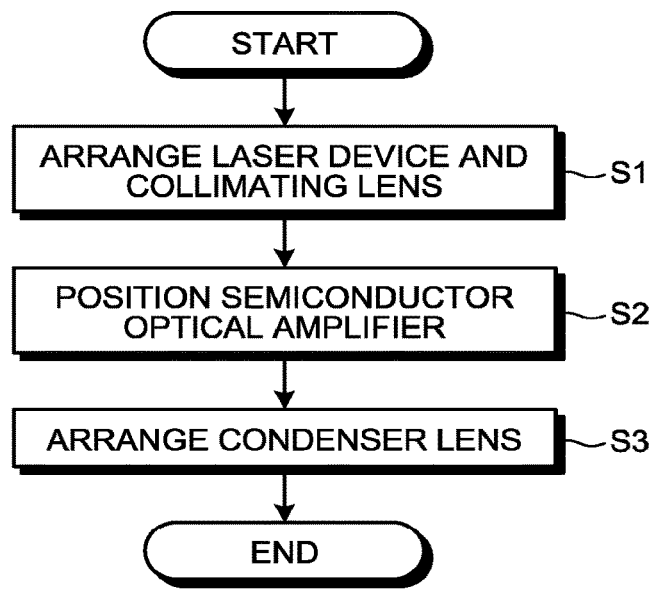
FIG. 2 is a flowchart illustrating the relevant part of a method of manufacturing a semiconductor laser module according to the first embodiment.
Figure 3:
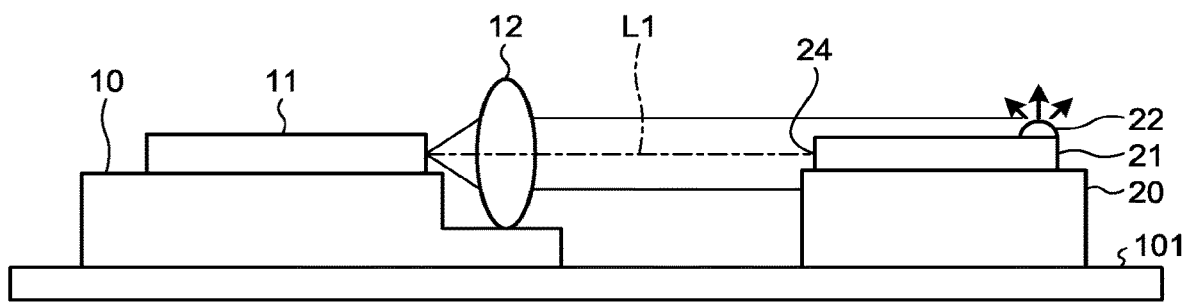
FIG. 3 is a diagram of a side schematic configuration of the semiconductor laser module at a step of positioning a semiconductor optical amplifier.
Figure 4:
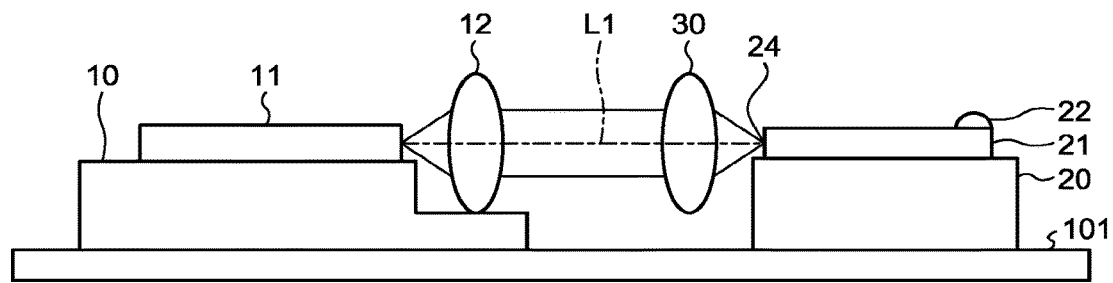
FIG. 4 is a diagram of a side schematic configuration of the semiconductor laser module at a step of arranging a condenser lens.

FIG. 2 is a flowchart illustrating a method of manufacturing the semiconductor laser module according to the first embodiment. FIG. 3 is a diagram of a side schematic configuration of the semiconductor laser module at a step of positioning a semiconductor optical amplifier. FIG. 4 is a diagram of a side schematic configuration of the semiconductor laser module at a step of arranging a condenser lens.

As illustrated in FIG. 2, the method of manufacturing a semiconductor laser module according to the first embodiment starts with a step of arranging the semiconductor laser device 11 and the collimating lens 12 (step 31). The step is described as a single step in the flowchart illustrated in FIG. 2. Alternatively, the step may be separated into two steps.

As described above, in the configuration example of the semiconductor laser module 100, the collimating lens 12 and the semiconductor laser device 11 are arranged on the same LD submount 10. Alternatively, the collimating lens 12 may be arranged independently of the semiconductor laser device 11. It is also possible to employ a configuration in which the collimating lens 12 is formed on the emission end face of the semiconductor laser device 11.

Accordingly, when the collimating lens 12 and the semiconductor laser device 11 are arranged on the same LD submount 10, the step S1 is realized by fixing the collimating lens 12 onto the LD submount 10 having the semiconductor laser device 11 fixed thereon and then the LD submount 10 is fixed onto the substrate 101 of the semiconductor laser module 100. When the collimating lens 12 is formed on the emission end face of the semiconductor laser device 11, fixing the semiconductor laser device 11 onto the substrate 101 of the semiconductor laser module 100 automatically fixes the collimating lens 12 onto the substrate of the semiconductor laser module 100, thereby realizing the step of step 1. For the configuration in which the collimating lens 12 is arranged independently of the semiconductor laser device 11, the step S1 is realized by fixing the semiconductor laser device 11 onto the substrate 101 of the semiconductor laser module 100 and then fixing the collimating lens 12 onto the substrate 101 of the semiconductor laser module 100.

In the method of manufacturing a semiconductor laser module according to the first embodiment, as illustrated in FIG. 2, a step of positioning the semiconductor optical amplifier 21 is then performed (step S2). FIG. 3 will be referred to because referring to FIG. 3 leads to easy understanding of description of the step.

The step of positioning the semiconductor optical amplifier 21 is performed by fixing, onto the substrate 101 of the semiconductor laser module 100, the SOA submount 20 having the semiconductor optical amplifier 21 and the protrusion 22 that are prepared in advance and fixed thereon. As described above, on the SOA submount 20, the protrusion 22 is provided on the extension line of the light path L1 of the laser light emitted from the semiconductor laser device 11, the extension line extending beyond to the incidence end 24 of the waveguide in the semiconductor optical amplifier 21. Furthermore, the diameter of the laser light that is rendered by the collimating lens 12 into parallel light is designed to be larger than the thickness of the semiconductor optical amplifier 21 and the protrusion 22 is configured to be higher in height than the semiconductor optical amplifier 21.

Thus, as illustrated in FIG. 3, at the step of positioning the semiconductor optical amplifier 21, part of the laser light traveling on the light path L1 passes above the semiconductor optical amplifier 21 and reaches the protrusion 22. Because the protrusion 22 is provided on the extension line of the light path L1 of the laser light emitted from the semiconductor laser device 11, the extension line extending beyond the incidence end 24 of the waveguide in the semiconductor optical amplifier 21, and the relative positional relationship between the semiconductor optical amplifier 21 and the protrusion 22 is fixed, the semiconductor optical amplifier 21 is possibly positioned (or roughly adjusted) by positioning the SOA submount 20, using the protrusion 22 as the target.

As illustrated in FIG. 2, in the method of manufacturing a semiconductor laser module according to the first embodiment, a step of arranging the condenser lens 30 (step S3) is performed. FIG. 4 will be referred to because referring to FIG. 4 leads to easy understanding of description of the step.

In the step of arranging the condenser lens 30, the condenser lens 30 is fixed between the collimating lens 12 and the semiconductor optical amplifier 21. The condenser lens 30 is an optical system for casing the laser light that is rendered by the collimating lens 12 into parallel light to be concentrated on the incidence end 24 of the waveguide in the semiconductor optical amplifier 21. The step of arranging the condenser lens 30 contains a step of finely adjusting the position of the condenser lens 30 such that the laser light that is rendered by the collimating lens 12 into parallel light is concentrated on the incidence end 24 of the waveguide in the semiconductor optical amplifier 21. As described above, it is possible to perform the fine adjustment while observing the intensity of the laser light that is output from the semiconductor optical amplifier 21. In the method of manufacturing a semiconductor laser module, rough adjustment on the position of the semiconductor optical amplifier 21 is completed at step S2 and this enables easy fine adjustment on the position of the condenser lens 30.

According to the semiconductor laser module 100 configured as described above and the method of manufacturing the semiconductor laser module 100, it is possible to facilitate accurate relative alignment between the semiconductor laser device 11 and the semiconductor optical amplifier 21.

Second Embodiment

Figure 5:
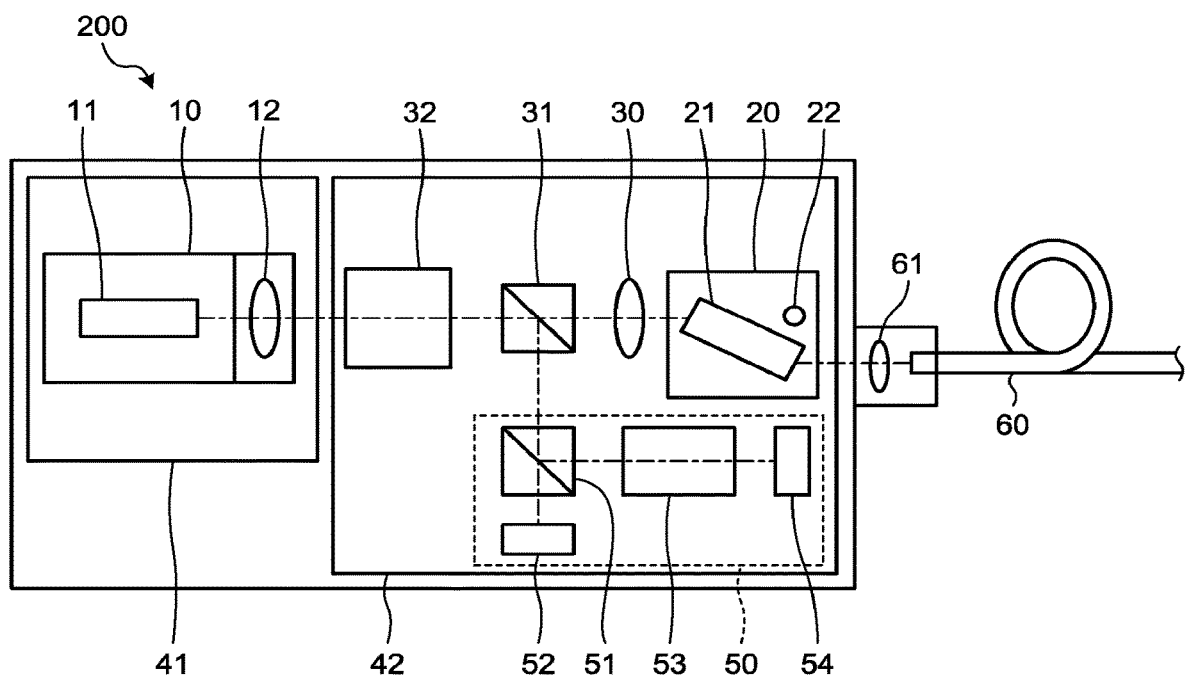
FIG. 5 is a diagram of a schematic configuration of a semiconductor laser module according to a second embodiment.

A semiconductor laser module according to a second embodiment will be described. FIG. 5 is a diagram of a schematic configuration of a semiconductor laser module according to a second embodiment. The configuration of a semiconductor laser module 200 according to the second embodiment illustrated in FIG. 5 is the same in many respects as that of the first embodiment. Thus, the same reference numbers as those of the first embodiment are assigned to the configuration of the semiconductor laser module 200 to be described below and thus description thereof will be omitted. It is understandable that the configuration and function of the component parts to which the same reference numbers are assigned to omit description thereof are substantially the same as those of the first embodiment.

As illustrated in FIG. 5, the semiconductor laser module 200 includes the LD submount 10 having the semiconductor laser device 11 and the collimating lens 12 thereon, the SOA submount 20 having the semiconductor optical amplifier 21 and the protrusion 22 thereon, and the condenser lens 30. The configuration of the semiconductor laser module 200 is substantially the same as that of the first embodiment.

The LD submount 10 having the semiconductor laser device 11 and the collimating lens 12 thereon is arranged on a LD thermoelectric element 41. The LD thermoelectric element 41 is, for example, a Peltier element that is able to heat and cool the semiconductor laser device 11 according to the intensity and direction of current that is supplied to the LD thermoelectric element 41. As described above, the semiconductor laser device 11 is a distributed feedback laser device that is able to change the emission wavelength by performing temperature control. Controlling the intensity and direction of the current supplied to the LD thermoelectric element 41 makes it possible to control the wavelength of laser light emitted from the semiconductor laser device 11.

The SOA submount 20 having the semiconductor optical amplifier 21 and the protrusion 22 thereon is arranged on an SOA thermoelectric element 42, which is, for example, a Peltier element. With this, the semiconductor optical amplifier 21 is cooled and heated, although the semiconductor optical amplifier 21 generates a relatively large amount of heat and thus scarcely positively heated. It is possible to optimally control the temperatures of the semiconductor optical amplifier 21 and the semiconductor laser device 11 because the semiconductor laser module 200 includes the SOA thermoelectric element 42 used to control the temperature of the semiconductor optical amplifier 21 independently from the LD thermoelectric element 41 used to control the temperature of the semiconductor laser device 11. Additionally, a waste of power consumption for temperature control on the semiconductor laser device 11 and the semiconductor optical amplifier 21 decreases is avoided, which leads to reduction in the total power consumption of the LD thermoelectric element 41 and the SOA thermoelectric element 42.

As illustrated in FIG. 5, the semiconductor laser module 200 according to the second embodiment includes a first beam splitter 31 and an isolator 32 between the collimating lens 12 and the condenser lens 30. The order in which the first beam splitter 31 and the isolator 32 are arranged is not limited to that illustrated in FIG. 5; however, it is preferable that the first beam splitter 31 and the isolator 32 be arranged in spots where the laser light between the collimating lens 12 and the condenser lens 30 is parallel light.

The first beam splitter 31 is an optical device configured to split the laser light emitted from the semiconductor laser device 11 and direct a part of the laser light to a wavelength locker 50 as split light. A commonly-used prism or filter splitting optical element can be used as the first beam splitter 31. The isolator 32 is an optical element configured to prevent the laser light that has been reflected by the optical element, such as the first beam splitter 31, and travels in an inverse direction from being incident on the semiconductor laser device 11. The isolator 32 is an optical element that is capable of changing a light path of the inversely-traveling laser light, utilizing polarization property of the laser light.

The wavelength locker 50 is a device for measuring the wavelength of the laser light that is split by the first beam splitter 31 and monitoring the wavelength of the laser light emitted by the semiconductor laser device 11. The laser light wavelength that is monitored by the wavelength locker 50 is fed back to a temperature controller (not illustrated) of the LD thermoelectric element 41, and accordingly feedback control is performed such that the semiconductor laser device 11 keeps emitting laser light at a desired wavelength.

The wavelength locker 50 includes a second beam splitter 51, a first light receiving element 52 that directly monitors the intensity of the laser light that has transmitted through the second beam splitter 51, and a second light receiving element 54 that monitors the intensity of the laser light that has been split by the second beam splitter and transmitted through an etalon filter 53. The etalon filter 53 is an optical element having cyclic transmission characteristics with respect to wavelength of light. Thus, measuring the ratio in intensity between the light that has transmitted through the etalon filter 53 and the light that has not transmitted through the etalon filter 53 makes it possible to specify the wavelength of light. The wavelength locker 50 measures the wavelength of the laser light that is split by the first beam splitter 31, using the ratio of the laser light intensity that is acquired by the first light receiving element 52 and the light intensity that is acquired by the second light receiving element 54.

Furthermore, as illustrated in FIG. 5, the semiconductor laser module 200 according to the second embodiment includes an optical fiber 60 that guides the laser light emitted from the semiconductor optical amplifier 21 to the outside of the semiconductor laser module 200; and a coupling optical system 61 for coupling the laser light that is emitted from the semiconductor optical amplifier 21 to the optical fiber 60. While the coupling optical system 61 illustrated in FIG. 5 is illustrated as being formed of a single lens, the coupling optical system 61 may be configured of separate multiple lenses, such as a collimating lens and a condenser lens. A position of the coupling optical system 61 is not limited to that illustrated in FIG. 5. As the optical fiber 60, it suffices if a commonly-used single-mode glass optical fiber having appropriate transmission characteristics to laser light emitted from the semiconductor laser device 11 be used.

With reference to FIGS. 6A to 6F and FIGS. 7A to 7D, two exemplary methods of assembling the semiconductor laser module 200 according to the second embodiment will be descried. FIGS. 6A to 6F are diagrams exemplifying a method of housing a substrate after assembling constituting parts on the substrate (referred to a first assembling method below); and FIGS. 7A to 7D are diagrams exemplifying a method of sequentially arranging component parts on a substrate in a casing (referred to a second assembling method below).

First Assembling Method

Figure 6A:
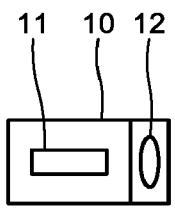
FIG. 6A is a diagram exemplifying a method of housing a substrate after assembling component parts on the substrate.

In a method of housing a substrate in a casing after assembling constituting parts on the substrate, first, the semiconductor laser device 11 and the collimating lens 12 are arranged on the LD submount 10 as illustrated in FIG. 6A.

Figure 6B:
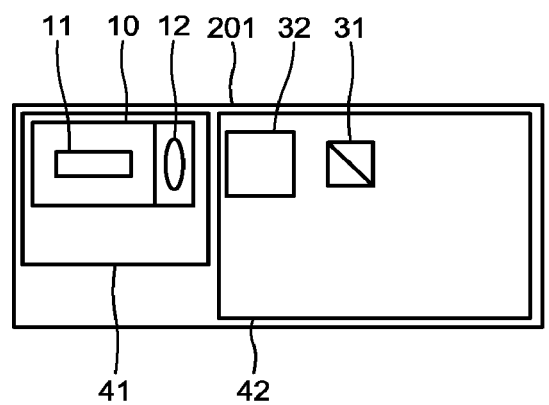
FIG. 6B is a diagram exemplifying the method of housing a substrate after assembling component parts on the substrate.

Thereafter, as illustrated in FIG. 6B, the LD thermoelectric element 41 and the SOA thermoelectric element 42 are arranged on a substrate 201. Then, the LD submount 10 is arranged on the LD thermoelectric element 41; and the first beam splitter 31 and the isolator 32 are arranged on the SOA thermoelectric element 42.

Figure 6C:
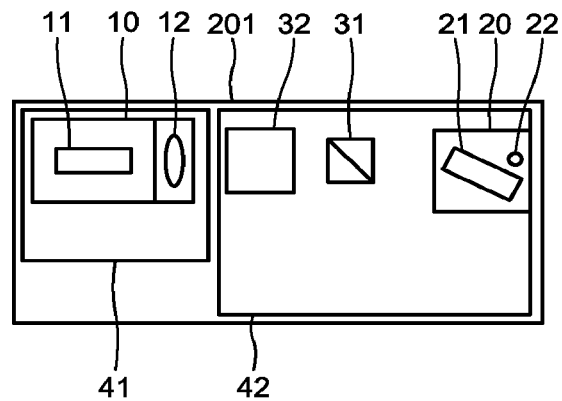
FIG. 6C is a diagram exemplifying the method of housing a substrate after assembling component parts on the substrate.

As illustrated in FIG. 6C, the SOA submount 20 having the semiconductor optical amplifier 21 and the protrusion 22 thereon is fixed onto the SOA thermoelectric element 42 while being positioned. The positioning method is, as described above, a method of positioning the semiconductor optical amplifier 21 such that the laser light that is emitted from the semiconductor laser device 11 and then is rendered by the collimating lens 12 into parallel light reaches the protrusion 22.

Figure 6D:
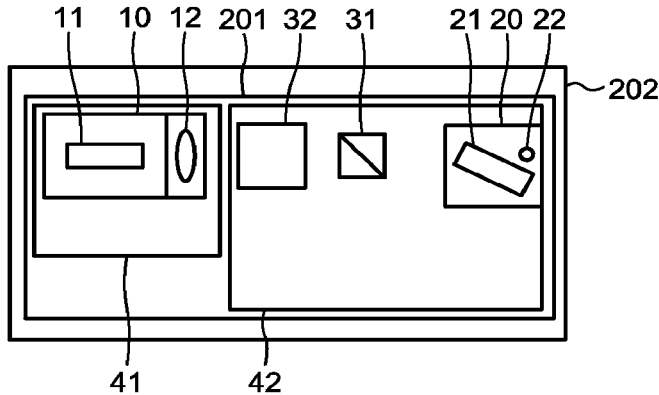
FIG. 6D is a diagram exemplifying the method of housing a substrate after assembling component parts on the substrate.

Thereafter, as illustrated in FIG. 6D, the substrate 201 is housed in a casing 202. It is preferable that the constituting parts that are arranged on the substrate 201 be wired to establish electric connection.

Figure 6E:
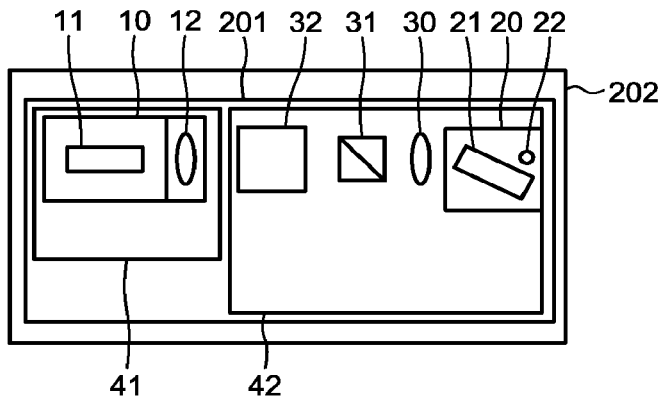
FIG. 6E is a diagram exemplifying the method of housing a substrate after assembling component parts on the substrate.

As illustrated in FIG. 6E, the condenser lens 30 is then arranged. The step of arranging the condenser lens 30 includes fine adjustment for causing the laser light that is emitted from the semiconductor laser device 11 and then is rendered by the collimating lens 12 into parallel light to be concentrated on the incidence end of the waveguide in the semiconductor optical amplifier 21. The fine adjustment can be performed by finely adjusting the position of the condenser lens 30 while monitoring the intensity of the laser light that is output from the semiconductor optical amplifier 21.

Figure 6F:
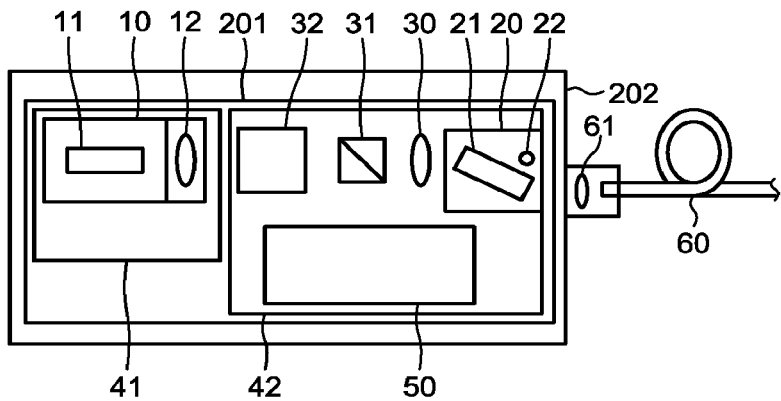
FIG. 6F is a diagram exemplifying the method of housing a substrate after assembling component parts on the substrate.

Lastly, as illustrated in FIG. 6F, the wavelength locker 50 is attached and the coupling optical system 61 and the optical fiber 60 are attached so that the semiconductor laser module according to the second embodiment is completed. The internal configuration of the wavelength locker 50 is as described above.

Second Assembling Method

In the method of sequentially arranging constituting parts on a substrate inside the casing, as the second assembling method, operations are performed in the casing and thus it is preferable to take the following measures; however, the method is not substantially different from the first assembling method. Description will be given focusing on an aspect different from that of the first assembling method.

Figure 7A:
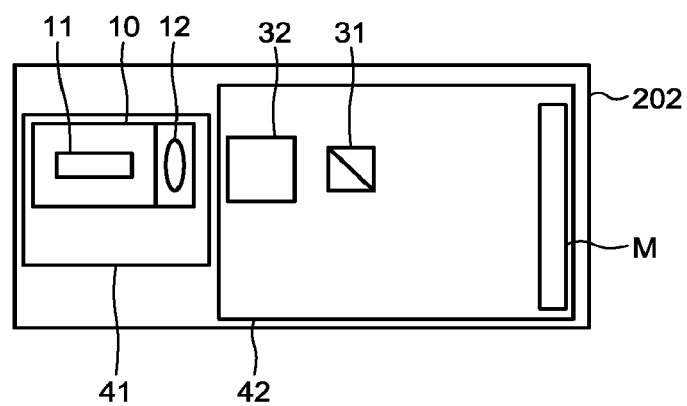
FIG. 7A is a diagram exemplifying a method of sequentially arranging component parts on a substrate in a casing.

First, as illustrated in FIG. 7A, the LD thermoelectric element 41 and the SOA thermoelectric element 42 are arranged in the casing 202, the LD submount 10 having the semiconductor laser device 11 and the collimating lens 12 thereon is arranged on the LD thermoelectric element 41, and the first beam splitter 31 and the isolator 32 are arranged on the SOA thermoelectric element 42.

The observation mirror M that is used for a positioning operation is arranged in the casing 202. Note that the position of the observation mirror M is not limited to the position illustrated in FIG. 7A and it suffices if the observation mirror M be arranged in a position appropriate to observe the protrusion during the positioning operation. If the protrusion is easily observed during the positioning operation, the observation mirror M is not necessarily arranged in the casing 202. Furthermore, it is possible to replace the observation mirror M with another member or part. For example, an observation window may be provided in part of the casing 202.

Figure 7B:
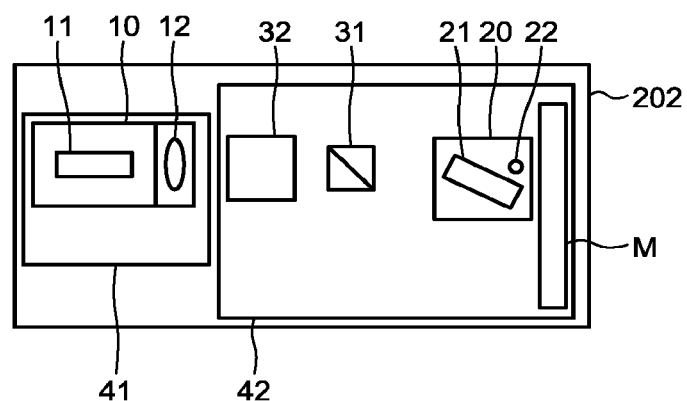
FIG. 7B is a diagram exemplifying the method of sequentially arranging component parts on a substrate in a casing.

As illustrated in FIG. 7B, the SOA submount 20 having the semiconductor optical amplifier 21 and the protrusion 22 thereon is fixed onto the SOA thermoelectric element 42 while being positioned. The positioning method is, as described above, a method of positioning the semiconductor optical amplifier 21 such that the laser light that is emitted from the semiconductor laser device 11 and then is rendered by the collimating lens 12 into parallel light reaches the protrusion 22. As described above, the observation mirror M is arranged in the casing 202 and this makes it possible to easily check reflection and scattering of the laser light having reached the protrusion 22.

Figure 7C:
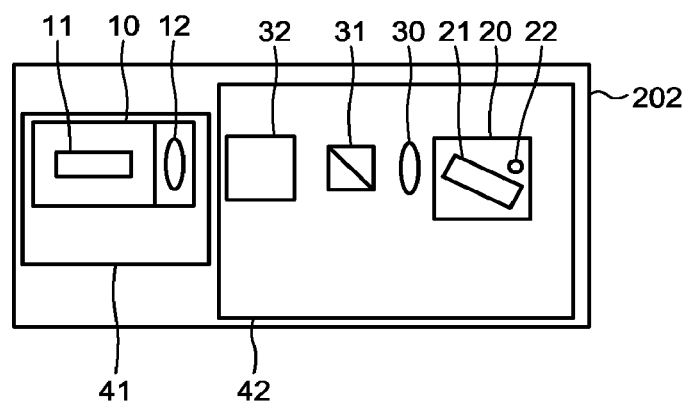
FIG. 7C is a diagram exemplifying the method of sequentially arranging component parts on a substrate in a casing.

Thereafter, as illustrated in FIG. 7C, the observation mirror M is removed and the condenser lens 30 is arranged. The step of arranging the condenser lens 30 includes fine adjustment for causing the laser light that is emitted from the semiconductor laser device 11 and then is rendered by the collimating lens 12 into parallel light to be concentrated on the incidence end of the waveguide in the semiconductor optical amplifier 21.

Figure 7D:
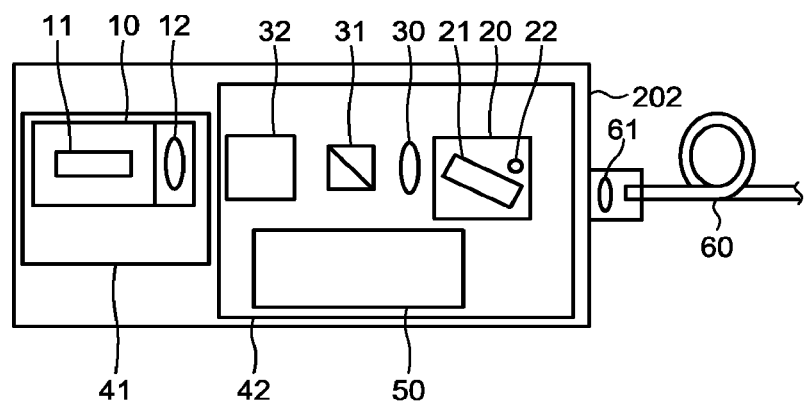
FIG. 7D is a diagram exemplifying the method of sequentially arranging component parts on a substrate in a casing.

Lastly, as illustrated in FIG. 7D, the wavelength locker 50 is attached and the coupling optical system 61 and the optical fiber 60 are attached so that the semiconductor laser module according to the second embodiment is completed.

Third Embodiment

Figure 8:
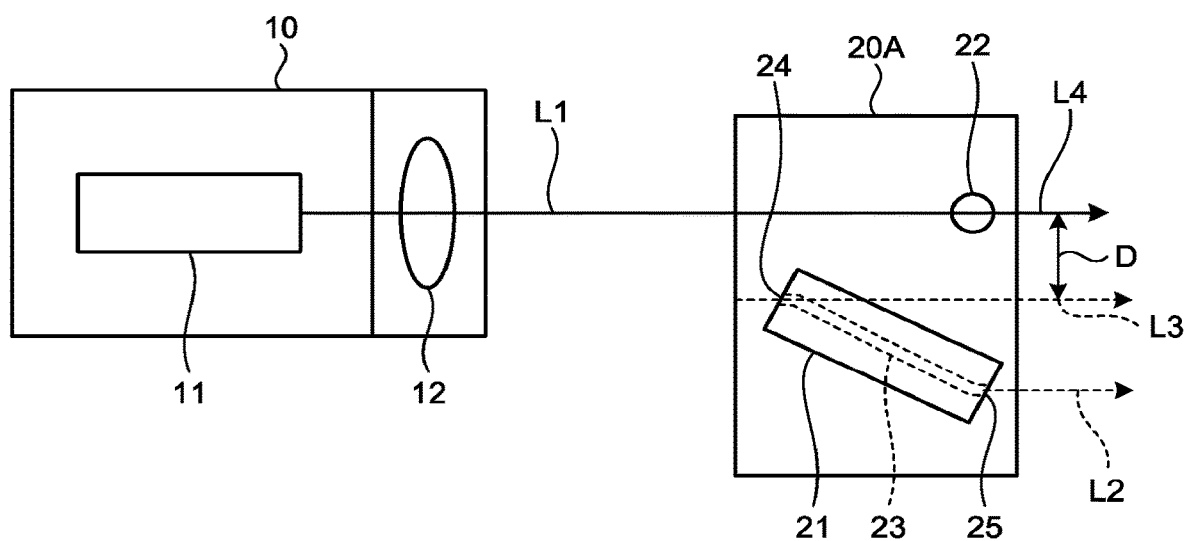
FIG. 8 is a diagram illustrating a semiconductor laser module according to a third embodiment.

A semiconductor laser module according to a third embodiment in which a protrusion is in a different position will be described using FIG. 8. For sake of simplicity, a substrate and a condenser lens are not illustrated in FIG. 8. In this embodiment, the protrusion 22 is formed on an SOA submount 20A, specifically on a line L4 the extension line of the light path L1 of laser light emitted from the semiconductor laser device 11. The line L4 is parallel with the extension line L3, which is specified in the first and the second embodiments. A distance D between the extension line L3 and the parallel line L4 is measured in advance and, after the SOA submount 20A is positioned by using the protrusion 22, the SOA submount 20A is shifted by the distance D to the upper side in FIG. 8 such that the extension line L3 and the parallel line L4 coincide with each other, and then the SOA submount 20A is fixed onto the substrate. This enables easy alignment between the light path L1 of the laser light emitted from the semiconductor laser device 11 and the incidence end 24 of the waveguide in the semiconductor optical amplifier 21.

The semiconductor laser modules and the methods of manufacturing a semiconductor laser module according to the embodiments produce an effect that it is possible to accurately perform relative alignment between a semiconductor laser device and a waveguide optical function device.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser module comprising:
a semiconductor laser device;
a waveguide optical function device that has an incidence end on which laser light emitted from the semiconductor laser device is incident, the waveguide optical function device including a waveguide configured to guide the incident light; and
a protrusion that is provided on an extension line of a light path of the laser light emitted from the semiconductor laser device, the extension line extending beyond the incidence end of the waveguide of the waveguide optical function device, the protrusion being configured to at least one of scatter and reflect the laser light, wherein:
a position of the protrusion being fixed relative to the waveguide optical function device, and
a height of the protrusion being set to be greater than a height of the waveguide optical function device; and
a collimating lens and a condenser lens being arranged between the semiconductor laser device and the waveguide optical function device, the collimating lens being arranging on a side of the semiconductor laser device, the condenser lens being arranged on a side of the waveguide optical function device, wherein:
the laser light emitted from the semiconductor laser device being spatially coupled to the incidence end of the waveguide in the waveguide optical function device via the collimating lens and the condenser lens,
when the condenser lens is not arranged, a diameter of the laser light that is rendered by the collimating lens into parallel light being set to be larger than a thickness of the waveguide optical function device such that part of the laser light traveling on the light path passes above the waveguide optical function device and reaches the protrusion, and
a position of the condenser lens being adjusted such that the laser light that is rendered by the collimating lens into the parallel light is concentrated on the incidence end of the waveguide in the waveguide optical function device.

2. The semiconductor laser module according to claim 1, further comprising a submount onto which the waveguide optical function device is fixed, wherein the protrusion is fixed onto the submount.

3. The semiconductor laser module according to claim 1, wherein the waveguide in the waveguide optical function device has a curved waveguide near the incidence end and the entire waveguide optical function device is arranged obliquely to the light path of the laser light that is emitted from the semiconductor laser device.

4. The semiconductor laser module according to claim 1, wherein the waveguide optical function device is a semiconductor optical amplifier that amplifies the incident laser light.

5. The semiconductor laser module according to claim 1, wherein the protrusion has a semispherical shape.

6. The semiconductor laser module according to claim 1, wherein the protrusion has a cylindrical shape.

7. The semiconductor laser module according to claim 1, wherein the protrusion is made of metal.

8. The semiconductor laser module according to claim 7, wherein the protrusion is made of gold (Au).

9. A method of manufacturing a semiconductor laser module including a semiconductor laser device and a waveguide optical function device on which laser light emitted from the semiconductor laser device is incident, the waveguide optical function device including a waveguide configured to guide the incident light, the method comprising:
fixing a position of the semiconductor laser device relative to a substrate of the semiconductor laser module;
arranging, between the semiconductor laser device and the waveguide optical function device, a collimating lens that renders the laser light that is emitted from the semiconductor laser device into parallel light to fix a position the collimating lens relative to the semiconductor laser device;
positioning a first submount onto which the waveguide optical function device and a protrusion that is provided on an extension line in an incidence direction from an incidence end of the waveguide in the waveguide optical function device are fixed together such that at least a portion of the laser light that is rendered by the collimating lens into parallel light reaches the protrusion and fixing the first submount onto the substrate, the protrusion being configured to at least one of reflect and scatter the laser light; and fixing, between the collimating lens and the waveguide optical function device, a condenser lens for causing the laser light that is rendered by the collimating lens into parallel light to be concentrated on the incidence end of the waveguide of the waveguide optical function device, wherein:

a height of the protrusion is set to be greater than a height of the waveguide optical function device, and a diameter of the laser light that is rendered by the collimating lens into parallel light is set to be larger than a thickness of the waveguide optical function device such that part of the laser light traveling on the light path passes above the waveguide optical function device and reaches the protrusion.

10. The method according to claim 9, wherein the arranging the collimating lens includes fixing the collimating lens onto a second submount having the semiconductor laser device fixed thereon, and the fixing the position of the semiconductor laser device includes, after the arranging the collimating lens, fixing, onto the substrate, the second submount having the semiconductor laser device and the collimating lens fixed thereon.

* * * * *